United States Patent
Dobisz et al.

(10) Patent No.: US 10,305,031 B1
(45) Date of Patent: May 28, 2019

(54) METHOD FOR MANUFACTURING A CHEMICAL GUIDANCE PATTERN FOR BLOCK COPOLYMER SELF ASSEMBLY FROM PHOTOLITHOGRAPHICALLY DEFINED TOPOGRAPHIC BLOCK COPOLYMER GUIDED SELF ASSEMBLY

(71) Applicant: Spin Memory, Inc., Fremont, CA (US)

(72) Inventors: Elizabeth A. Dobisz, San Jose, CA (US); Prachi Shrivastava, Newark, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/866,362

(22) Filed: Jan. 9, 2018

(51) Int. Cl.
| | |
|---|---|
| *H01L 21/00* | (2006.01) |
| *H01L 43/12* | (2006.01) |
| *H01L 27/22* | (2006.01) |
| *H01L 43/08* | (2006.01) |
| *H01L 21/033* | (2006.01) |
| *H01L 21/027* | (2006.01) |

(52) U.S. Cl.
CPC ............ *H01L 43/12* (2013.01); *H01L 27/222* (2013.01); *H01L 43/08* (2013.01); *H01L 21/0276* (2013.01); *H01L 21/0335* (2013.01); *H01L 21/0337* (2013.01); *H01L 21/0338* (2013.01)

(58) Field of Classification Search
CPC ........ H01L 43/08; H01L 43/12; H01L 27/222
USPC .............................................. 438/3
See application file for complete search history.

(56) References Cited

U.S. PATENT DOCUMENTS

2014/0365688 A1* 12/2014 Lee .................. H01L 43/08
710/7
2017/0069837 A1* 3/2017 Choi .................. H01L 43/12

* cited by examiner

Primary Examiner — David S Blum
(74) Attorney, Agent, or Firm — Zilka-Kotab, P.C.

(57) ABSTRACT

A method for manufacturing a magnetic random access memory array at a density greater than would be possible using photolithography. The method involves patterning a chemical template material with patterned portions separated by a center to center distance that is substantially equal to a natural period of a block copolymer. A block copolymer material is then deposited and annealed to form self assembled cylinders that are located over the patterned regions of the chemical template and also over areas between the patterned regions. The chemical template layer can be patterned by depositing a first, preliminary block copolymer, over a mask structure and annealing the mask structure to form cylinders in the openings in the mask structure. The cylinders can be removed leaving openings, and a UV exposure can be performed to expose and treat portions of the chemical template layer that are exposed through the opening.

17 Claims, 22 Drawing Sheets

METHOD FOR MANUFACTURING A CHEMICAL GUIDANCE PATTERN FOR BLOCK COPOLYMER SELF ASSEMBLY FROM PHOTOLITHOGRAPHICALLY DEFINED TOPOGRAPHIC BLOCK COPOLYMER GUIDED SELF ASSEMBLY

FIELD OF THE INVENTION

The present invention relates to magnetic random access memory (MRAM) and more particularly to a method for manufacturing a high density magnetic memory element array.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state.

Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a method for forming an array of pillars having a density that is greater than that which would be possible using purely photolithographic processes. A pillar material such as a layer of materials making up a magnetic memory element is first deposited. A hard mask layer is deposited over the pillar material, followed by a chemical template material. The chemical template material is patterned with chemically patterned portions, that are arranged with a spacing that is an integer multiple of a natural period of a block copolymer. Then, the block copolymer material is deposited over the patterned chemical template layer. The block copolymer material is annealed, forming self assembled cylinders that are located both over the chemically patterned portions of the block copolymer and over in areas there-between as determined by the natural period of the block copolymer material. The cylinders of block copolymer material are then treated to form hard mask structures. These hard mask structures can then be used to pattern the hard mask layer, which can then be used to pattern pillar features from the pillar material.

The chemical template layer can be patterned using a first block copolymer that can be deposited prior to the previously mentioned second block copolymer. A template such as a photoresist mask can be formed having openings that are photolithographically patterned to have a spacing that is substantially equal to an integer multiple of a natural period of the second block copolymer. The first block copolymer is then deposited over the template mask and annealed to form self assembled cylinders in the openings in the mask template. These cylinders can then be removed, leaving cylindrical openings having a much smaller feature size than what would be possible using photolithography. An etching such as reactive ion etching can be used to transfer the image of these openings onto an underlying soluble polymer located between the mask template and the chemical template layer, thereby exposing a portion of the chemical template layer. The oxygen ions from the reactive ion etching also chemically pattern the chemical template layer. A chemical liftoff process can be performed using a solvent to remove the soluble polymer and any overlying layers without negatively affecting the patterning of the chemical template layer.

This process allows very small feature size pillars to be formed at a density that is much greater than what would be possible using photolithography. The self assembly of a first copolymer can be used to pattern small features sizes on a chemical template. Then, this patterned chemical template can be used to define cylindrical pillar structures using a second block copolymer, at a density that is several times greater than the density of the pattern of the chemical template layer.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
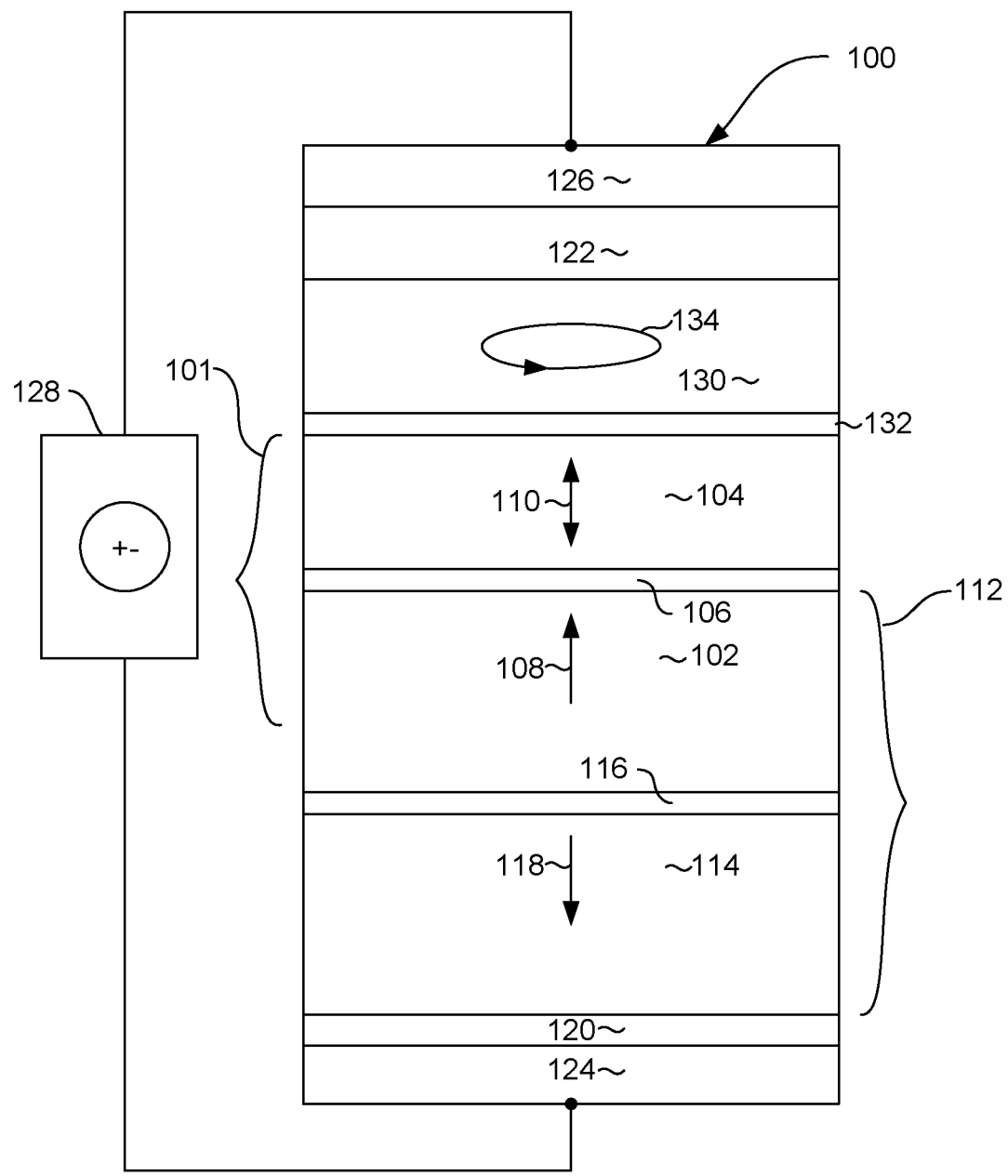
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Au and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
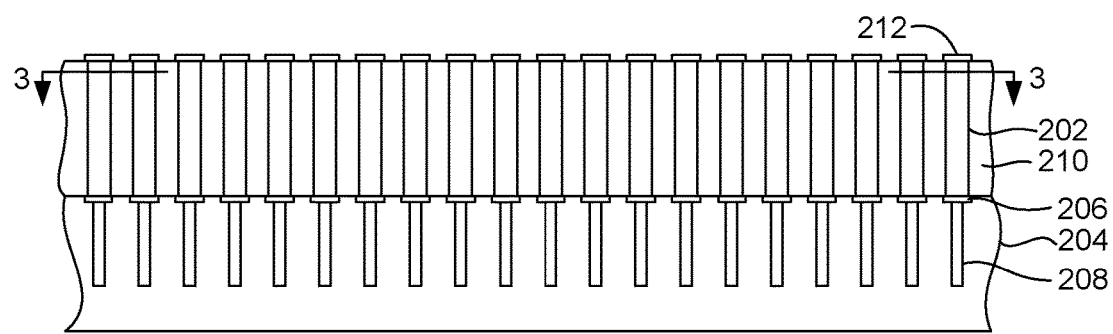
FIG. 2 is a side, cross sectional view of an array of magnetic random access memory elements formed on a substrate.

FIG. 2 shows a side, cross sectional view of an array 200 of magnetic random access memory elements 202 formed on a substrate 204. The substrate 204 can be a semiconductor material such as Si formed from a Si wafer. Each of the magnetic memory elements can be formed on an electrically conductive lead 206 that can connect the magnetic memory element 202 with underlying circuitry such as CMOS circuitry 208 embedded in the substrate 204. The memory elements 202 can be surrounded by an insulating material 210 such as $SiO_2$ or alumina $Al_2O_3$, and electrically conductive upper leads 212.

Figure 3:
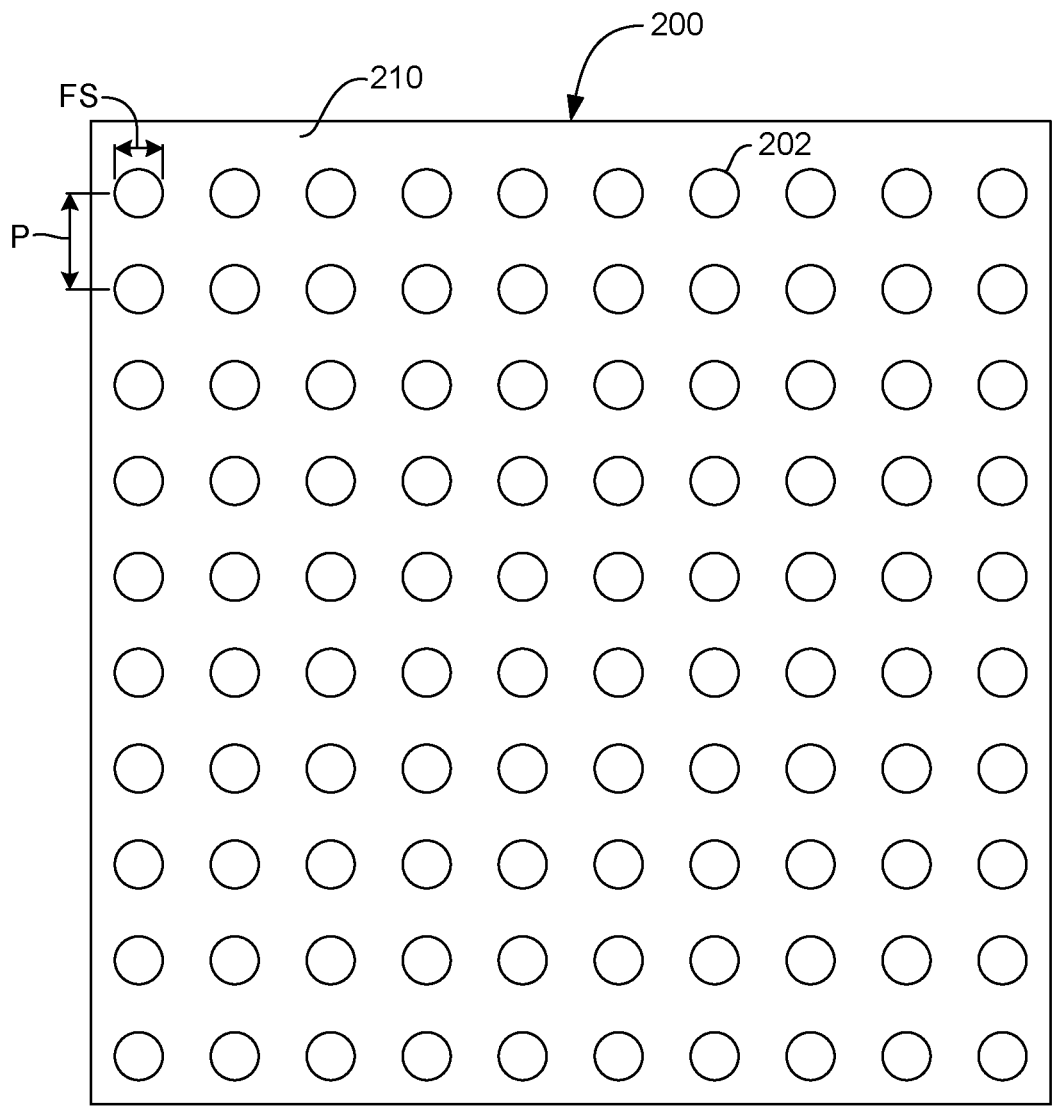
FIG. 3 is a top-down view of the array of magnetic random access memory elements as seen from line 3-3 of FIG. 2.

FIG. 3 shows a top-down, cross-sectional view as seen from line 3-3 of FIG. 2. From, both FIGS. 2 and 3, it can be seen that each of the magnetic memory elements 202 is formed as a cylindrically shaped pillar. In order to increase data density, it becomes necessary increase the number of memory elements 202 in a given area in the array 200. In FIG. 3, it can be seen that the distance between a given location on a memory element 202 to that same location on an adjacent magnetic memory element 202 defines a pitch (P) of the array. This size of each memory element 202 (in this case the diameter of the memory element cylinder) defines the feature size (FS).

With continued reference to FIG. 3, in order to increase data density of a magnetic random access array 200, it is necessary to decrease pitch P and feature size FS. However, processes such as photolithography, which are generally used to define features on a substrate such as a semiconductor wafer, have physical limitations. For example, photolithographic masking and exposure processes are limited by the wavelength of light that can be used to pattern images on the wafer. This has resulted in limits to the amount by which dimensions such as pitch P and features size FS can be reduced and has also correspondingly limited the amount by which data density can be increased.

The present invention overcomes this challenge, allowing features such as magnetic memory elements to be formed at a pitch P and features size FS that are far smaller than the physical limitations of processes such as photolithography.

Figure 4:
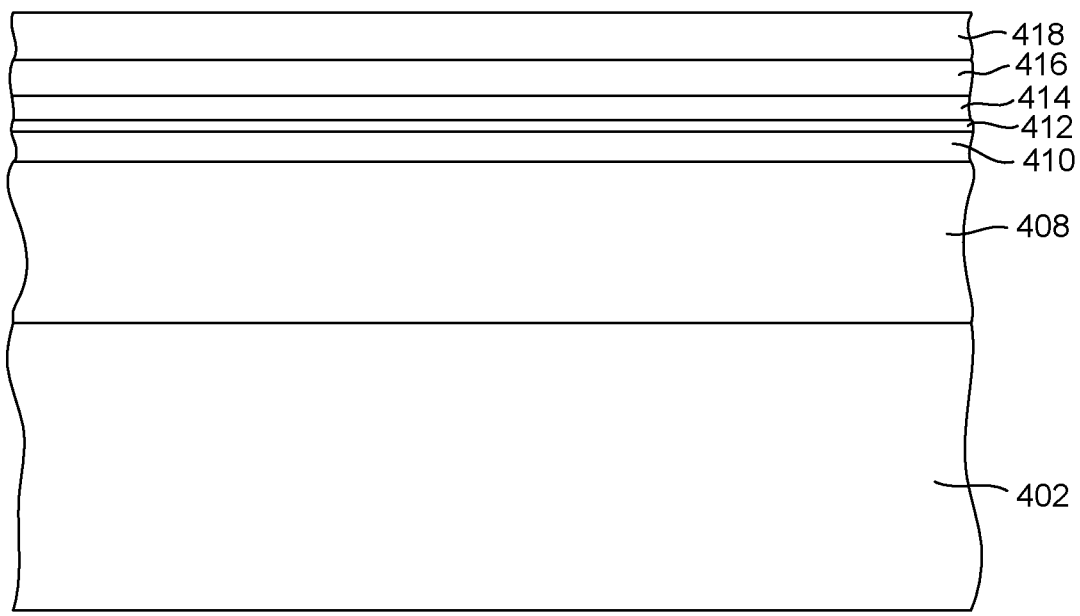
FIGS. 4-21, are views of a wafer in various intermediate stages of manufacture, illustrating a method for manufacturing an array of magnetic random access memory elements.

FIG. 4 shows a side, cross sectional view of a substrate 402 which can be a wafer such as a silicon wafer. The wafer can have electrically conductive lead layers (not shown) formed in its surface, the lead layers being arranged for connection with a magnetic memory pillar formed thereon. The electrically conductive lead layers can be connected with underlying circuitry 406 such as CMOS circuitry (also not shown).

With continued reference to FIG. 4, a layer of magnetic memory element material 408 is deposited over the substrate 402. Although shown in FIG. 4 as a single layer, it should be understood that this material layer 408 actually include various layers used to form a magnetic memory element such as the magnetic memory element 100 of FIG. 1. For example, the layer 408 would include a first and second magnetic layers and a non-magnetic barrier layer located between the first and second magnetic layers, as well as other layer necessary to form a magnetic memory element.

With continued reference to FIG. 4, a hard mask material 410 is deposited over the memory element material 408. The hard mask material 410 can be a material such as TaN. A chemical template material 412 is can be deposited over the hard mask 410. The chemical template material 412 is a material such as a brush (monomolecular layer grafted to the hard mask 410), or mat (a spin on polymer that is cross linked). A thin soluble polymer material such as DUR-AMIDE® 414 is deposited over the hard brush material 412. An optional antireflective coating 416 is deposited over the soluble polymer material 414. The antireflective coating 416 can be a plurality of layers that can include a bottom antireflective coating (BARC). A layer of photoresist material 418 is then deposited.

The surface energy of the chemical template 412 can range from neutral to preferential to the block copolymer matrix surrounding the block copolymer pillars (yet to be formed). The chemical template 412 can be a comprised of a single or random mixture of the units. For a polystyrene-b-PMMA block copolymer, the chemical template 412 can be all styrene or a mixture of styrene and methyl methacrylate monomer units. Each monomer unit has a functional group on the end that will bind to the hard mask material 410. Oxygen RIE exposure renders the surface of the chemical template 412 favorable to the formation of self assembled block copolymer cylinders.

Figure 5:
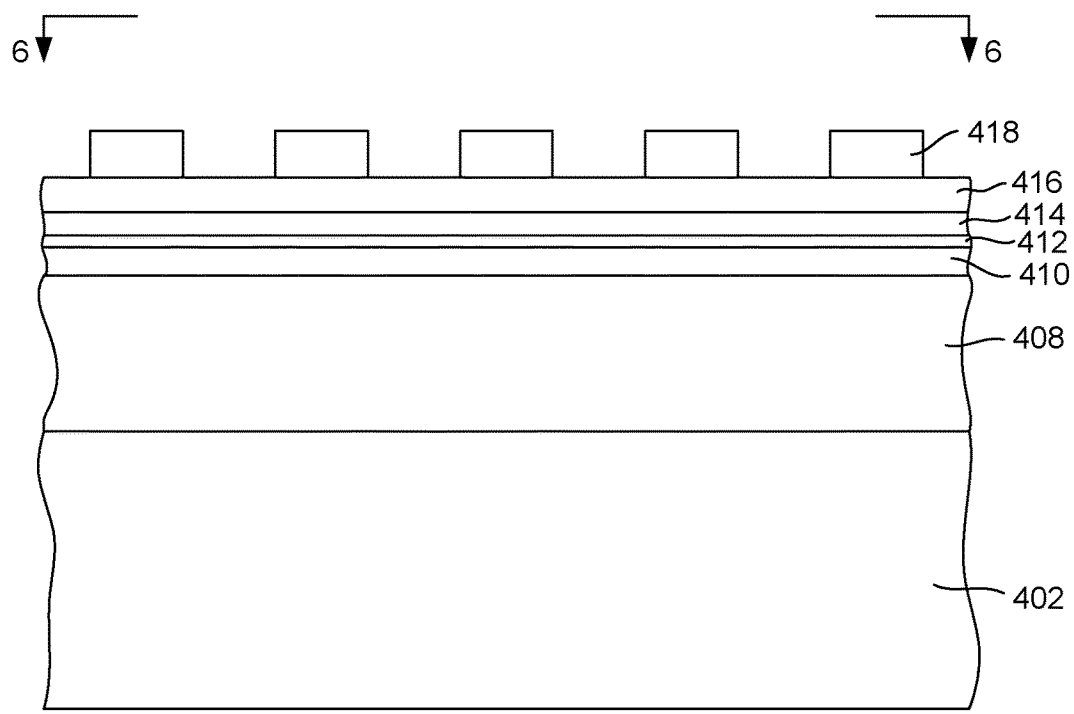
Figure 6:
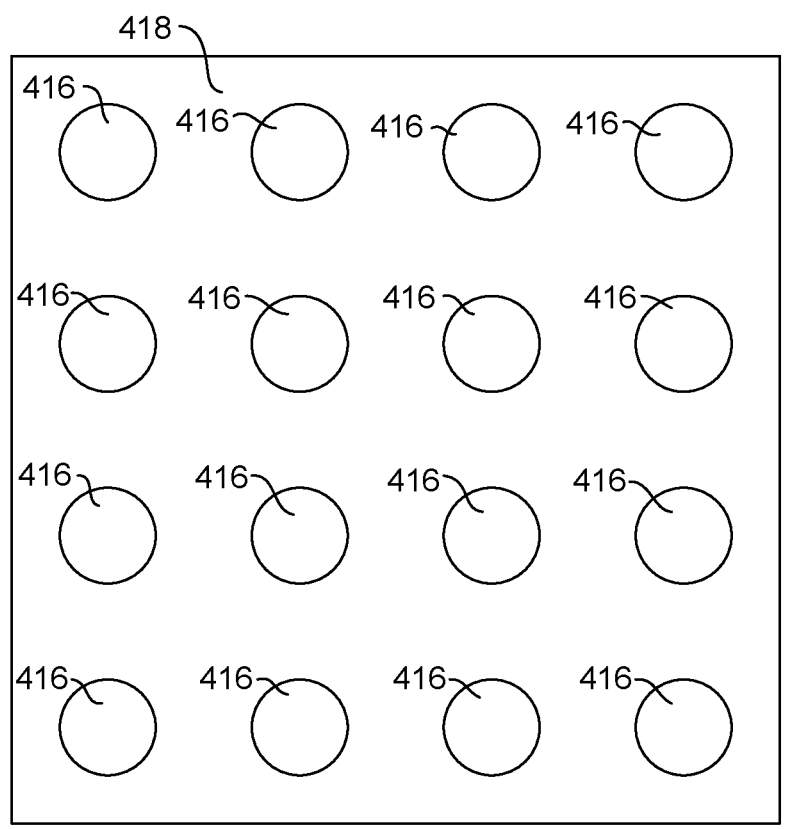

With reference now to FIG. 5, the photoresist material 418 is photolithographically patterned to form a photoresist mask 418 having openings. The openings in the photoresist mask 418 can be better understood with reference to FIG. 6, which shows circular openings in the photoresist layer 418 exposing the underlying layer 416. The photoresist mask 418 is patterned so that the openings have a center to center spacing that is an integer multiple of the natural period of a second block copolymer material that will be deposited and processed steps to be further described herein below.

Figure 7:
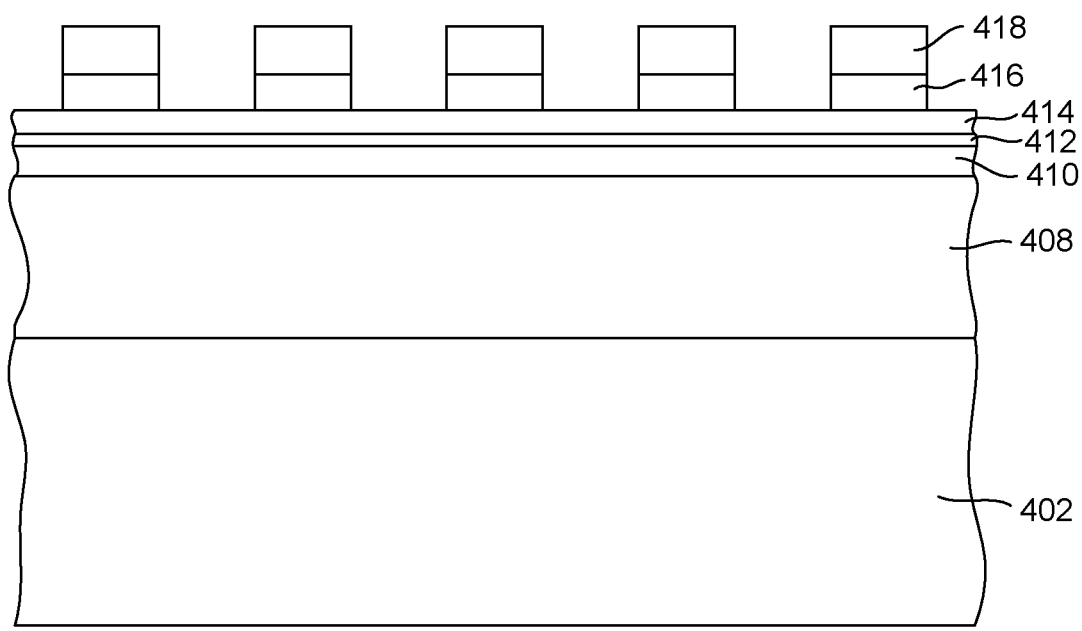
Figure 8:
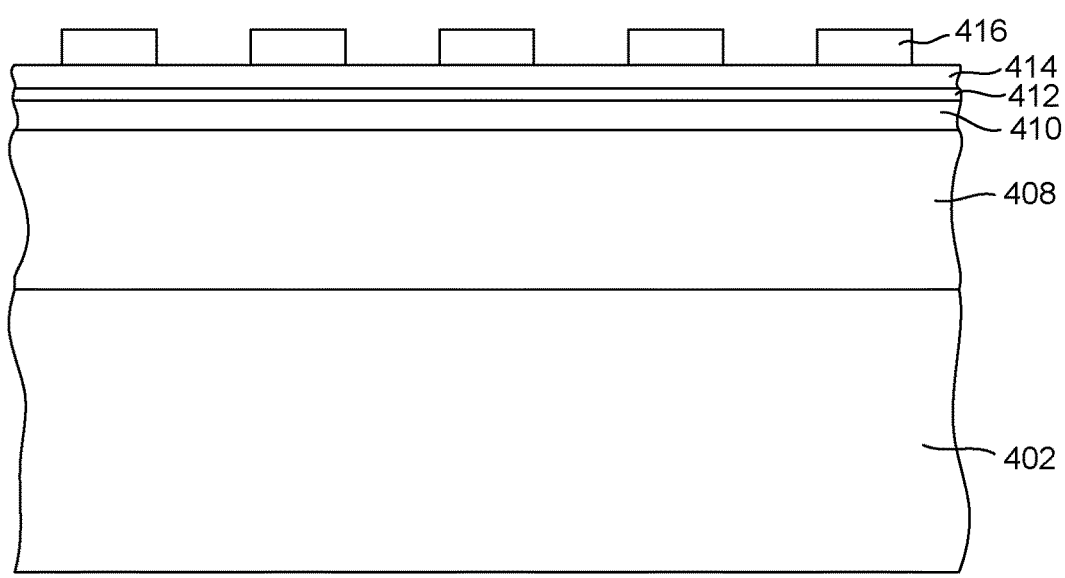

With reference now to FIG. 7, an etching process can be performed to transfer the image of the photoresist mask 418 onto the underlying anti-reflective coating 416. Some or all of the photoresist mask 418 might be removed by the etching process which would leave a structure such as that shown in FIG. 8.

Figure 9:
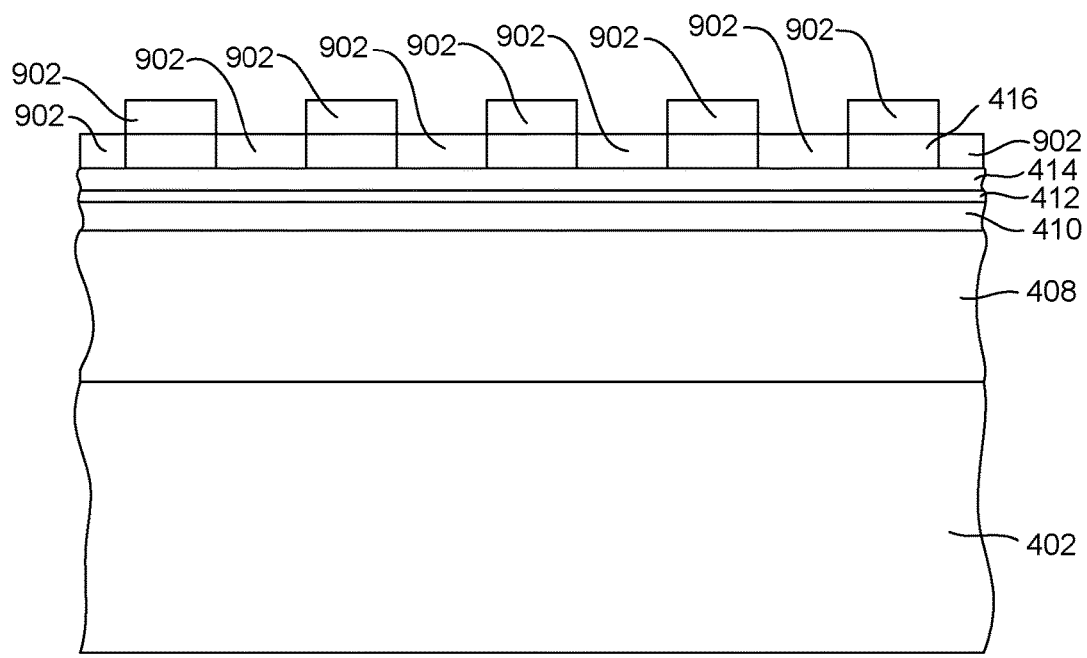

Then, with reference to FIG. 9, a first layer of block copolymer material 902 is deposited full film. The block copolymer material 902 is a cylinder forming block copolymer material such as polystyrene-b-polymethyl methacrylate 902, and is deposited so that it deposits into the openings in the anti-reflective coating 416 as well as over the antireflective coating 416.

Figure 10:
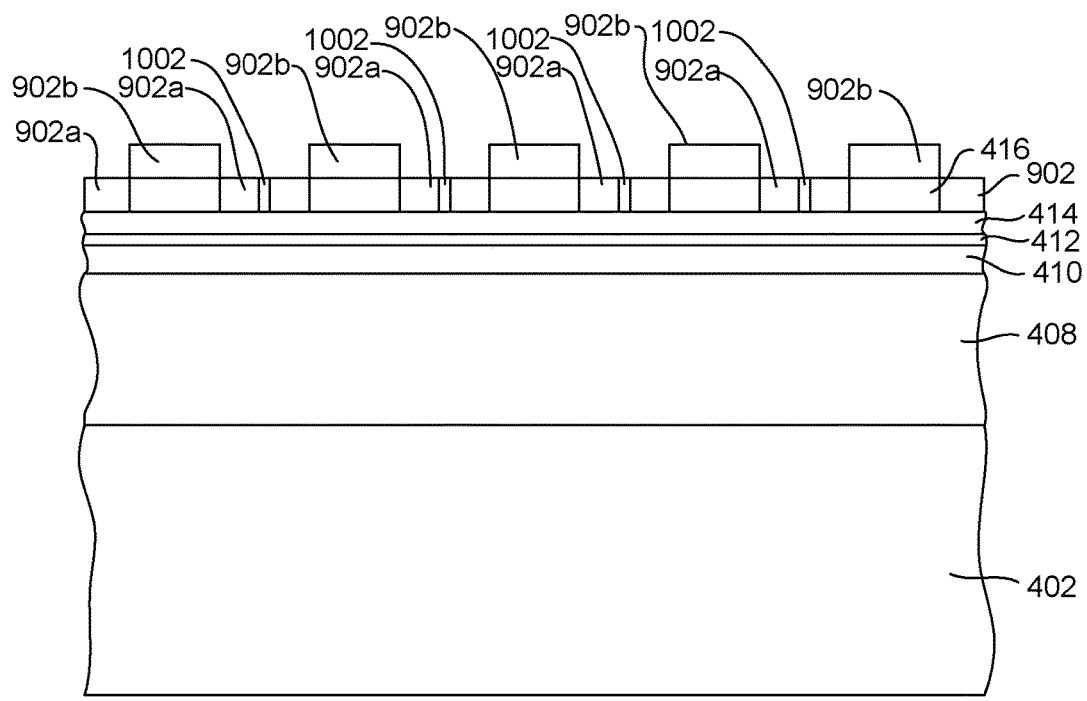

With reference now to FIG. 10, an annealing process is performed. The annealing process is performed by subjecting the block copolymer material 902 to a temperature such of about 200-250 degrees C. for a duration of about 1-3 hours in a nitrogen ($N_2$) atmosphere. The annealing of the block copolymer material 902 causes the block copolymer material to segregate. In the bounded portions contained by the template of the anti-reflective coating 416, the annealed block copolymer 902 segregates to form narrow cylinders 1002. The narrow cylinders can be a material such as PMMA that segregates from the surrounding block copolymer matrix 902a. In the regions above the mask/template 416, the block the annealing causes the block copolymer 902b to become a mixture of unordered, random cylinders in a block copolymer matrix.

Figure 11:
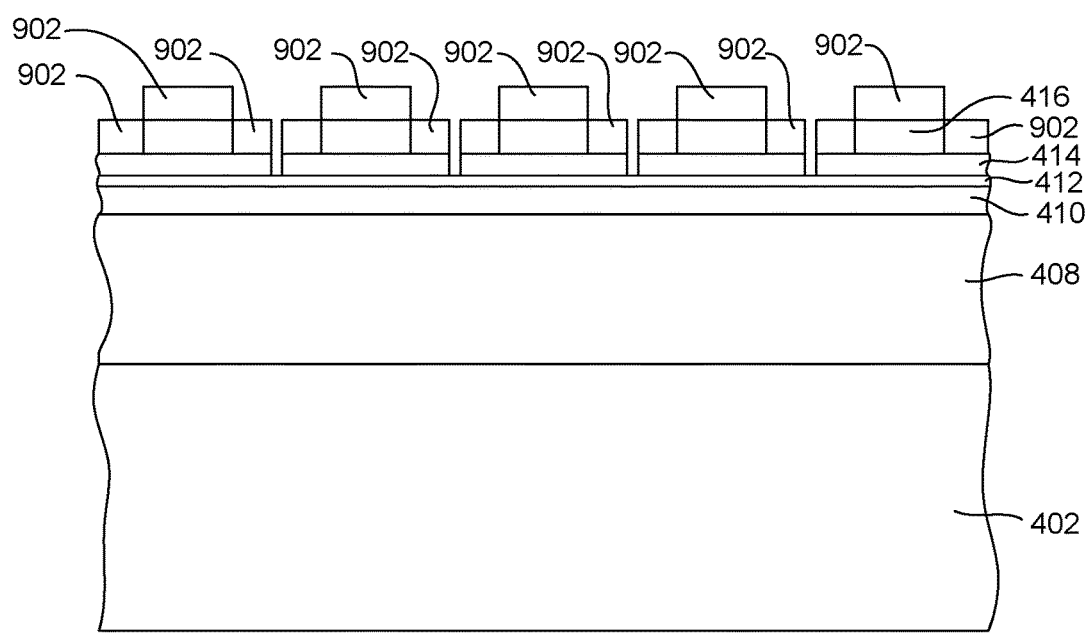

A process can then be performed to remove the narrow cylinder material 1002, leaving as structure such as that shown in FIG. 11. The process used to remove the narrow cylinder material 1002 can include exposing to ultraviolet light, (UV) and performing an etching. The UV light exposure can be useful to dissociate cylinder chains and cross link the surrounding copolymer component to increase etch selectivity. The etching is performed sufficiently to extend through the soluble polymer material 414, stopping at the brush material 412.

Once the cylinders 414 have been removed to expose a small pattern of the chemical template layer (e.g. brush layer) 412, a brief plasma exposure can be performed to set a chemical pattern in the brush layer 412. This plasma exposure chemically changes only the portion of the brush layer 412 that is exposed through the openings in the layer 414, thereby allowing the brush layer 412 to function as a chemical template for layer processes as will be seen.

Figure 12:
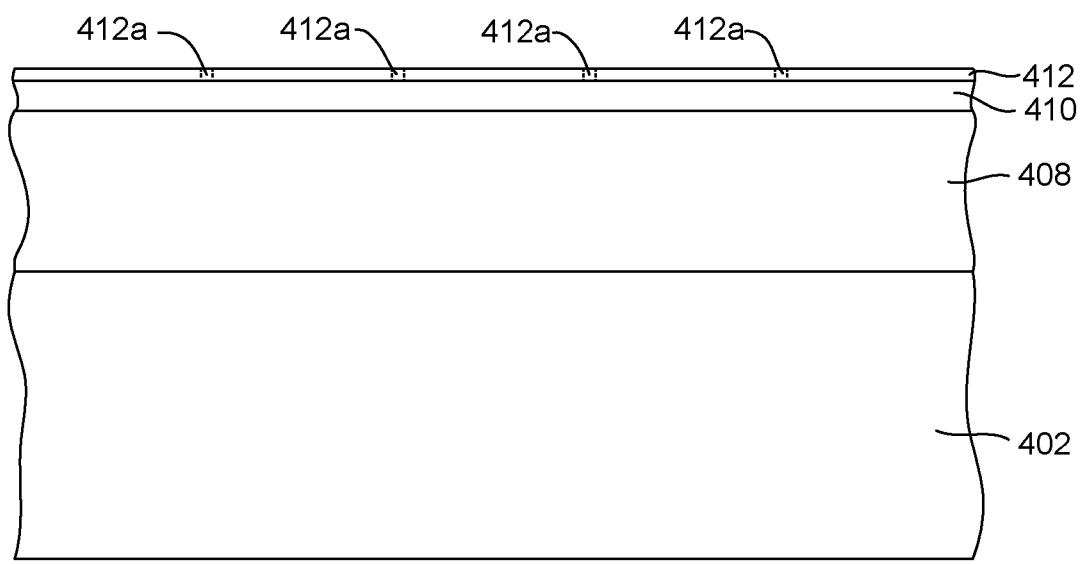

After the brush layer 412 has been chemically patterned as described above, the layers 414, 416, 902 can be lifted off using a solvent, leaving a structure as shown in FIG. 12. In FIG. 12, the chemically patterned areas are shown dashed line portions 412a. In this process, the solvent process used to dissolve and remove the layer 414, and overlying layers 416, 902, does not damage or affect the previously defined chemical pattern on the brush layer 412. If an etching process such as reactive ion etching (RIE) were used to remove the layers over the brush layer 412, the etching process would damage the previously defined pattern in the brush layer 412.

Figure 13:
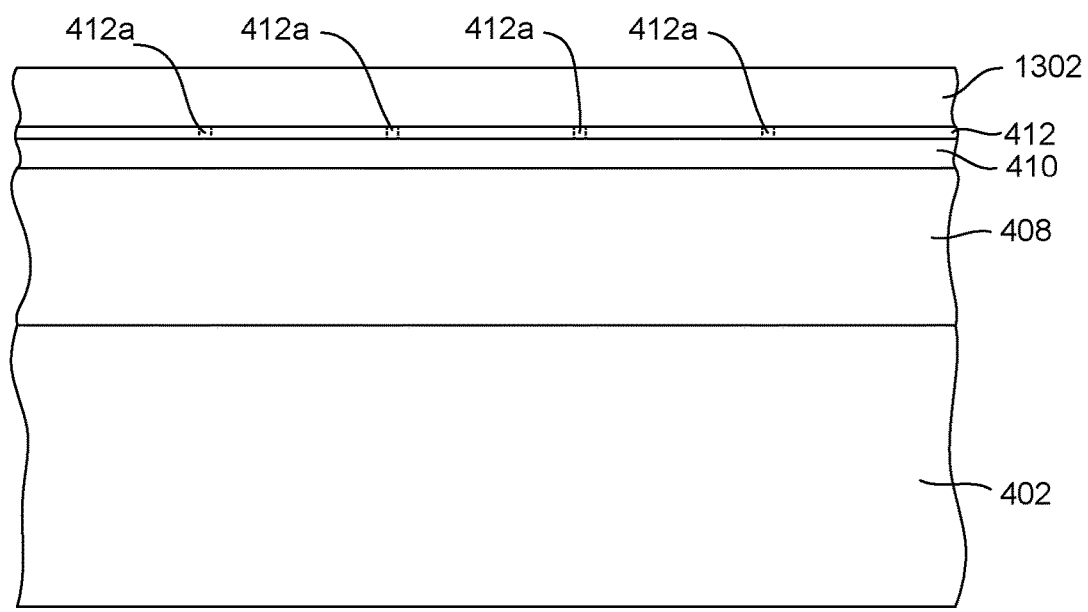

With reference now to FIG. 13, a second block copolymer material 1302 is deposited over the patterned brush layer 412. The second block copolymer material 1302 can be a material such as polystyrene-b-polymethylmethacrylate. As previously mentioned, the previously formed photoresist mask 418 (FIGS. 5 and 6) was patterned with openings having a center to center spacing that is an integer multiple of the second block copolymer material 1302 deposited in FIG. 13. Therefore, the chemically patterned regions 412a are also separated by a center to center distance that is an integer multiple of the natural period of the second block copolymer material 1302.

Figure 14:
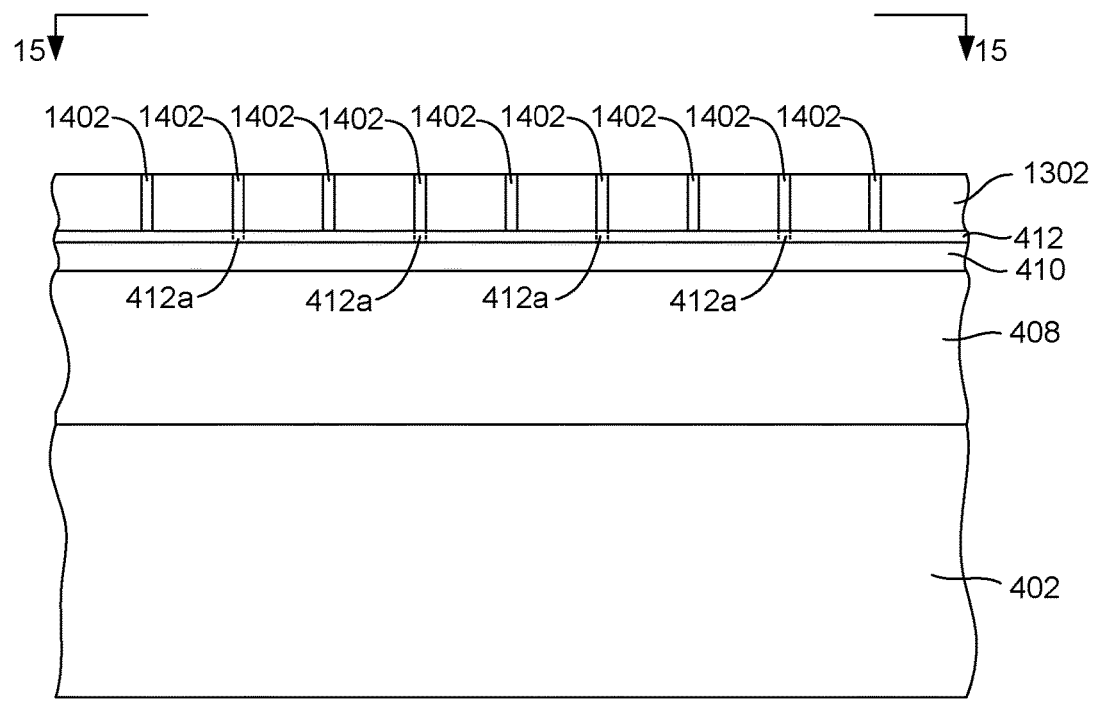

Then, an annealing process is performed to cause the second block copolymer material to order itself to form cylindrical pillars 1302a as shown in FIG. 14. The patterned brush layer 412 acts as a chemical template for guiding the ordered formation of the cylindrical pillars 1402. Some of the cylindrical pillars 1402a will form over the chemically patterned regions 412a of the brush layer 412. However, because the patterned regions 412a are spaced apart by a distance that is an integer multiple of the natural period of the second block copolymer material 1302, other pillars 1402 will form in an ordered pattern in regions between the patterned regions 412a. In the example, shown in FIG. 14, the patterned regions 412a of the brush layer 412 are patterned at a spacing that is twice the natural period of the second block copolymer material 1302. Therefore, there is one extra cylinder 1402 between each of the cylinders 1402a located over the patterned regions 412a. However, other spacings could be used. For example, if the patterned regions 412a are spaced apart by a distance that is three times the natural period of the second block copolymer, there would two pillars between each of the pillars 1402a. Similarly, the spacing could be 3 or 4 times the natural period of the second block copolymer material 1302, in which case there would be even more cylinders 1402 formed between the patterned regions 412a.

Figure 15:
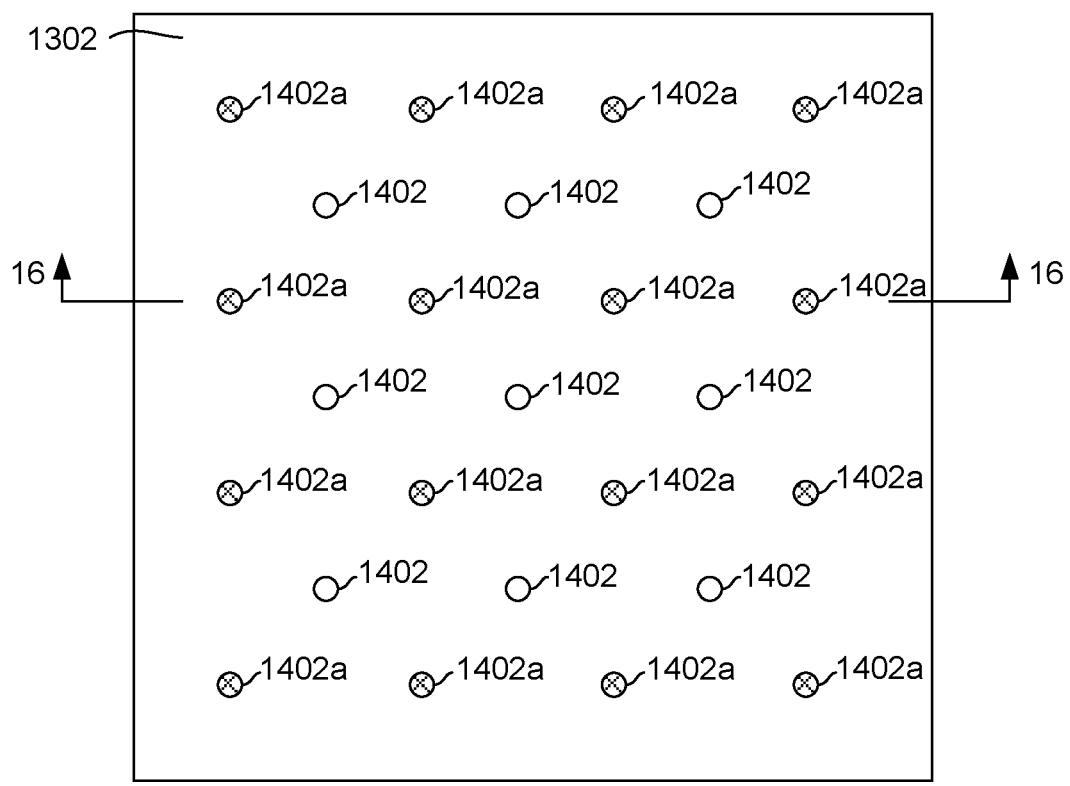

In the example of FIG. 14, the arrangement of pillars 1402 can be better understood with reference to FIG. 15, which shows a top down view as seen from line 15-15 of FIG. 14. In FIG. 15, it can be seen that the pillars 1402 arrange themselves in a hexagonal close packed arrangement. The pillars 1402a that are formed over patterned portions of the brush layer 412 (FIG. 14) are shown in cross-hatch in FIG. 15. The other additional pillars 1402 form between the pillars 1402a. As can be seen, this doubles the number of pillars that can be formed. The spacing between the pillars is limited only by the natural period of the second block co-polymer material 1302 rather than by the physical limits of photolithography. This means that the pitch of the memory array can be greatly reduced below the limits of photolithography.

With the cylindrical pillars 1402 defined as discussed above, the pillars 1402 are converted into etch resistant pillars. This can be accomplished according to at least two possible processes. One way in which this can be accomplished, is through selective metal oxide or semiconductor infusion. In this process the wafer with the block copolymer cylinders 1402 formed thereon is repeatedly exposed to metal infusion followed by oxidation. For example, the wafer and cylinders 1402 can be exposed to a metal vapor, such as tetrammethylalumina (TMA) to infuse aluminum into the cylinders 1402 followed by exposure to water vapor ($H_2O$) to oxidize the infused alumina. The infusion and oxidation processes are repeated a number of times until the cylinders 1402 become etch resistant metal oxide pillars surrounded by a block copolymer matrix. Then, the surrounding block copolymer matrix surrounding the cylinders 1402 can be removed, such as by etching, leaving free standing metal oxide pillars 1402.

Another way in which such etch resistant pillars can be formed is to remove the cylinders 1402 and refill with an etch-resistant material. Starting with a structure such as that shown in FIGS. 14 and 15, the block copolymer material 1302, 1402 can be exposed to ultra-violet light, (UV exposure). This UV exposure cross links the outer block copolymer matrix 1302 and breaks down the cylinders 1402. An etching such as dry or wet etch can then be performed to remove the cylinder 1402, leaving narrow cylindrical holes where the cylinders 1402 were. An etch-resistant material can then be deposited to fill the openings left by the removed cylinders 1402. This can be, for example, a conformal coating of spin on glass (HSQ) or deposition of an appropriate oxide, such as by plasma vapor deposition (PVD) or atomic layer deposition ALD. An etching process can be performed to remove the portion of the deposited material formed over the block copolymer matrix 1302. A further etching process can be performed to remove the surrounding block copolymer matrix 1302, leaving free standing etch resistant pillars 1402.

Figure 16:
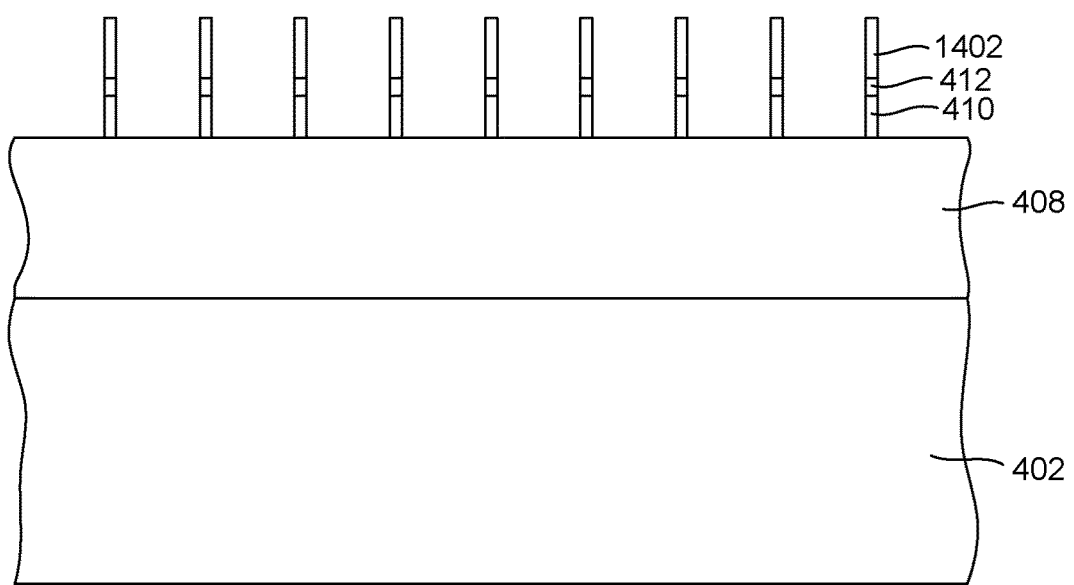

With the free standing etch resistant pillars 1402 thus formed, the image of the etch resistant pillars 1402 can be transferred onto the underlying hard mask material and anti-reflective coating, leaving a structure such as is shown in side, cross-section in FIG. 16. This can be performed, for example, by performing a reactive ion etching (RIE) in a chemistry that is chosen to selectively remove the material of the hard mask layer 410.

Figure 17:
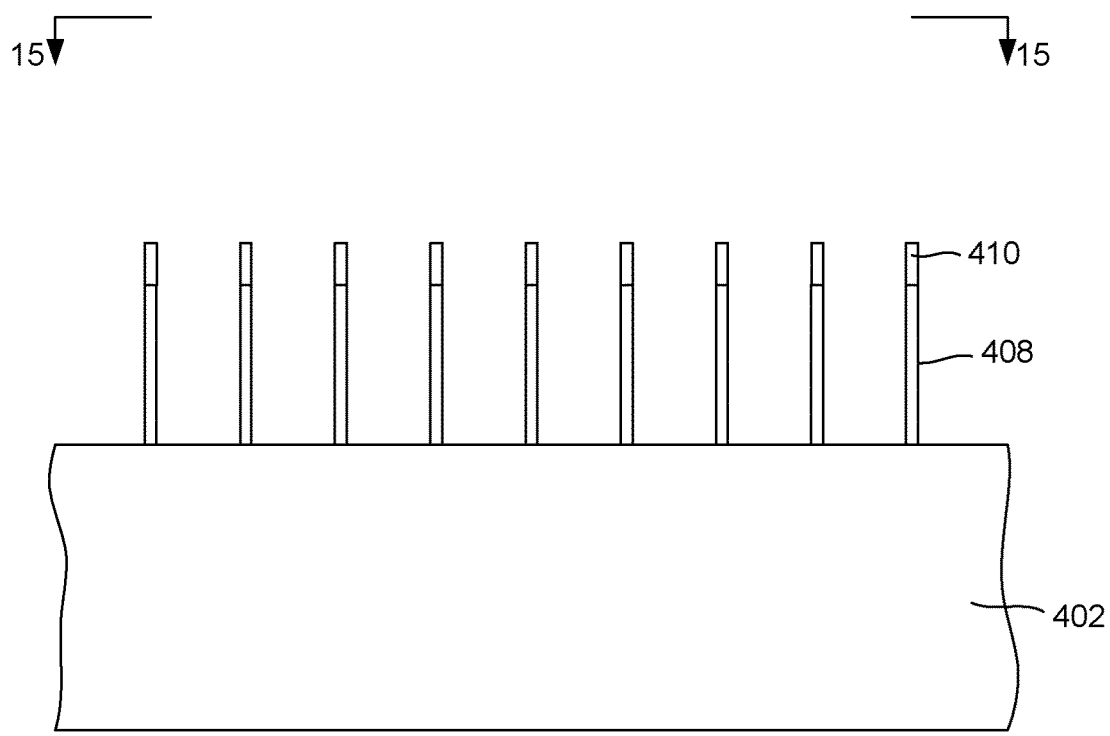

Then, with the hard mask 410 patterned, another material removal process such as ion milling can be performed to remove portions of the magnetic memory material 408 that are not protected by the patterned hard mask 410, leaving a structure such as shown in FIG. 17.

Figure 18:
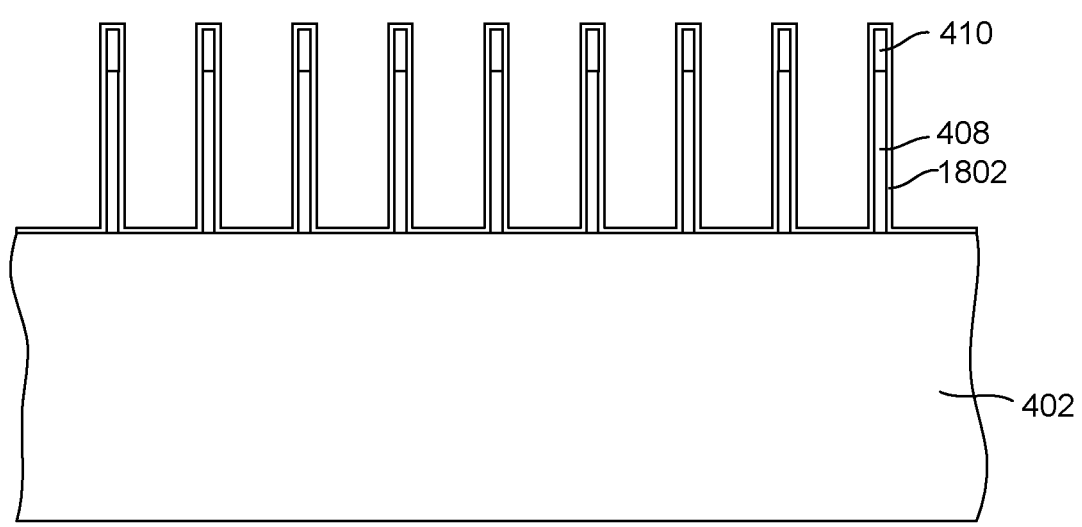
Figure 19:
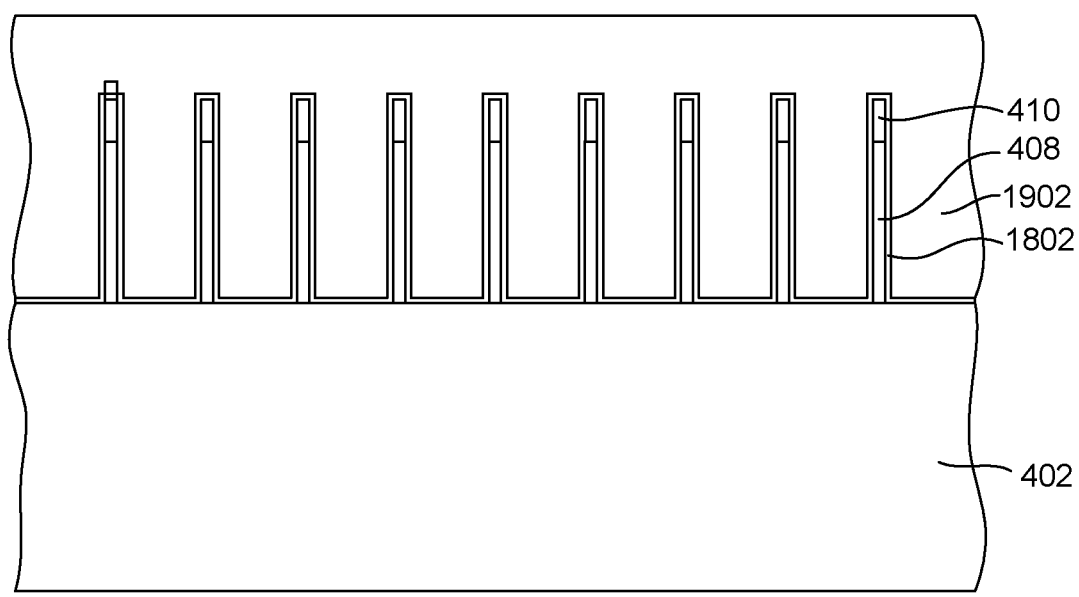

Then, with reference to FIG. 18, a thin passivation layer 1802 is deposited. The passivation layer 1802 can be a thin, electrically insulating layer such as SiN or $SiO_2$, which can be deposited by a conformal deposition process such as atomic layer deposition or chemical vapor deposition. The passivation layer 1802 is preferably deposited in-situ. (e.g. without breaking vacuum). Then, with reference to FIG. 19, an electrically insulating fill layer 1902 is deposited. The electrically insulating fill layer 1902 can be a material such as $SiN_X$ or $SiO_2$, and can be deposited by sputter deposition. The passivation layer 1802 protects the memory element pillars 408 during the sputter deposition of the fill layer 1902.

Figure 20:
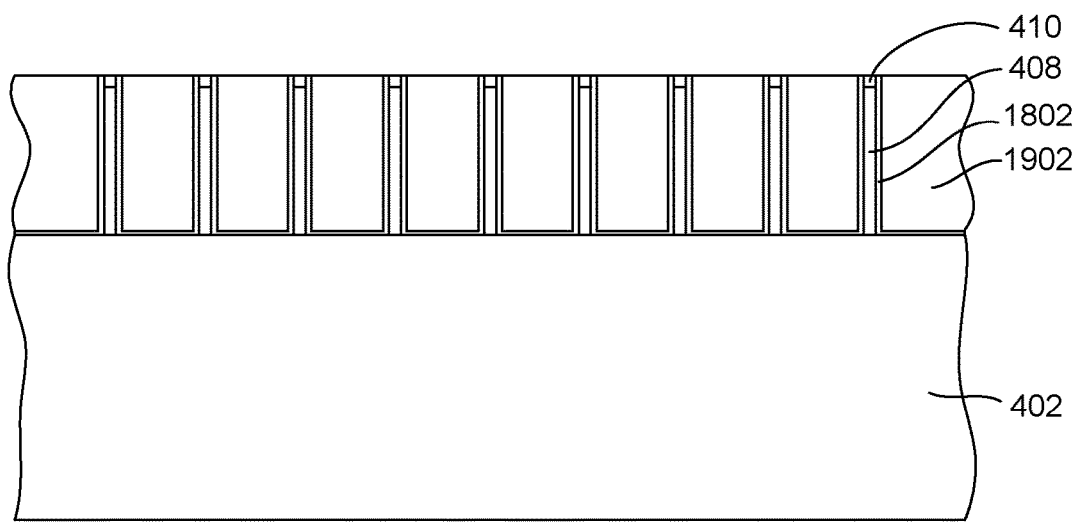
Figure 21:
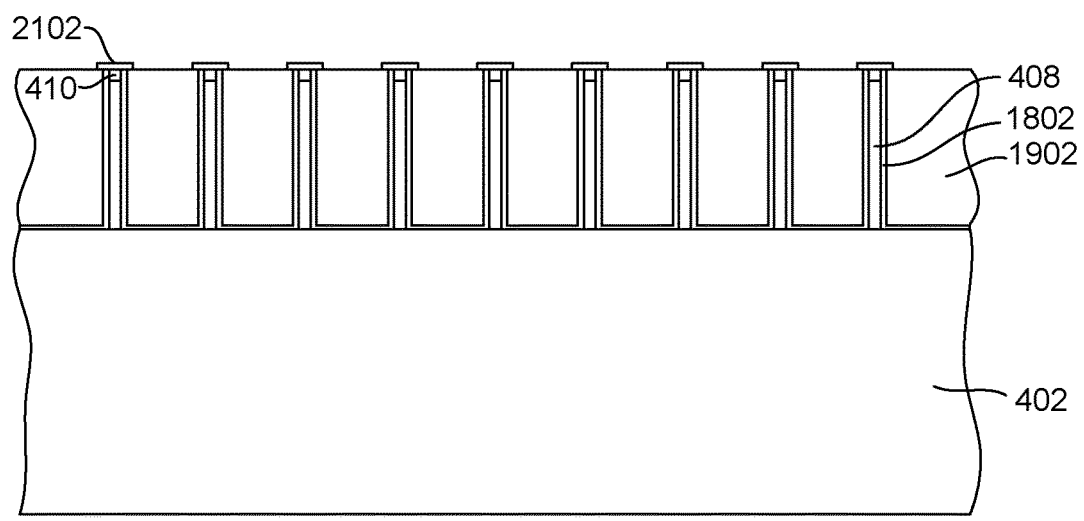

Then, a chemical mechanical polishing process can then be performed to planarize the surface. The chemical mechanical polishing process can be stopped at the hard mask layer 410, leaving a structure as shown in FIG. 20. Electrically conductive electrodes 2102 can then be formed over the memory elements 408, leaving a structure as shown in FIG. 21.

Figure 22:
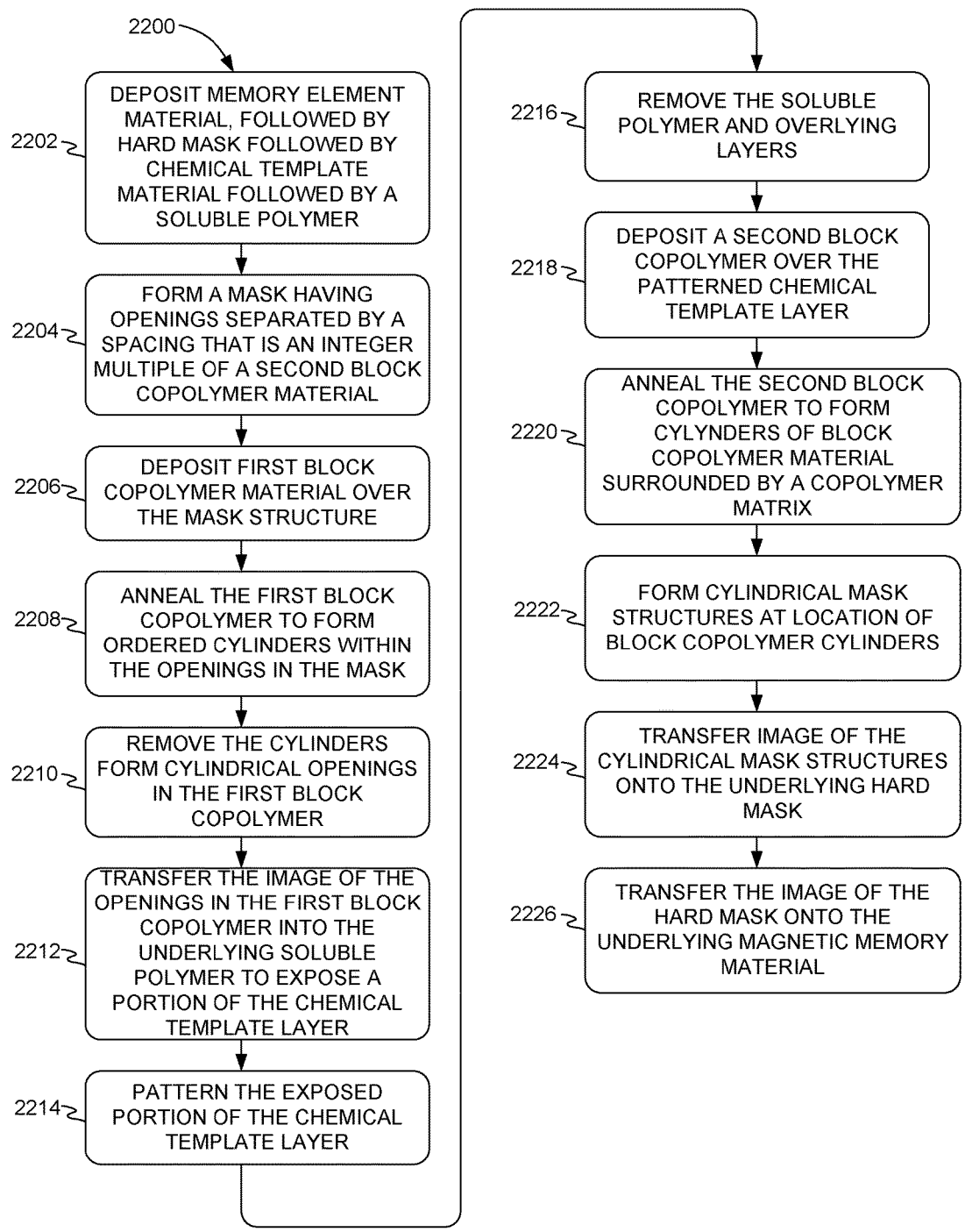
FIG. 22 is a flowchart summarizing a method for manufacturing an array of magnetic memory elements.

The above described process for manufacturing a magnetic memory element array can be summarized with reference to FIG. 22, which is a flowchart illustrating a method 2200 for manufacturing a magnetic memory element array. The method 2200 begins with a step 2202 of depositing a memory element material. The memory element material can be a series of layers making up a magnetic memory element such as a magnetic tunnel junction (MTJ) element. A hard mask material such as carbon, SiN, etc. is deposited over the memory element material. A chemical template layer such as a brush layer or mat layer is deposited over the hard mask, followed by a soluble polymer material such as DURIMIDE®.

In a step 2204 a mask is formed having openings or vias that are separated by a center to center spacing that is equal to an integer multiple of a natural period of a second block copolymer material to be deposited layer. The mask can be formed by depositing a layer of photoresist and then photolithographically patterning the photoresist to form the openings or vias.

Then, in a step 2206, a first block copolymer material is deposited over the mask, including into the openings in the mask. Then, in step 2208 an annealing process is performed, so as to cause the first block copolymer material to segregate and self align. This self alignment results in narrow vertical cylinders of block copolymer material being formed within the portions bounded by the openings in the mask. The narrow vertical cylinders are surrounded by copolymer matrix material.

Then, in a step 2210 the narrow vertical cylinders are removed and leaving an opening in the first block copolymer that is centered within the opening in the mask. In a step 2212 the openings in the first block copolymer are transferred onto the underlying soluble polymer, thereby exposing the underlying chemical template layer. In a step 2214 the image of the opening in the block copolymer and soluble polymer is transferred onto the underlying chemical template layer. This step does not actually remove the exposed portions of the chemical template layer, but chemically alters the exposed portions of the chemical template layer. This can be performed by exposing the uncovered portions of the chemical template layer to ultraviolet light (UV exposure).

Then, in a step 2216, the soluble polymer material is chemically lifted off by exposing it to a suitable solvent. This removal of the soluble polymer material also removes the overlying layers and does negatively affect the previously chemically processed pattern on the chemical template layer.

In a step 2018, a second block copolymer layer is deposited over the patterned chemical template layer. Then, in a step 2020, another annealing process is performed to anneal the second block copolymer. This second annealing forms self ordered narrow vertical cylinders of block copolymer material surrounded by block copolymer matrix. These cylinders form over the portions of the patterned chemical template material that were previously patterned by interaction with ions during the previous reactive ion etching process. However, because the pattern of the chemical template layer was at a spacing that is an integer multiple of the natural period of the second block copolymer material, the self aligned cylinders will also form in spaces between the patterned portions of the chemical template layer. This allows the density of these pillars to be increased by two or more times over the spacing of the patterned regions.

Then, in a step 2222, the cylindrical block copolymer cylinders are converted into cylindrical hard mask structures. This can be accomplished in at least one or two ways. For example, the second block copolymer material can be subjected to repeated processes of exposure to metal vapor and oxidation by exposure to water vapor. The exposure to metal vapor causes metal to diffuse into the cylindrical pillars and the oxidation step causes the metal diffused into the cylinders to oxidize forming a hard cylindrical metal-oxide mask. Another way in which this might be performed is to remove the cylinders of block copolymer material such as by etching, thereby leaving a block copolymer matrix having a cylindrical opening. The cylindrical opening can then be filled with a mask material such as metal oxide or spin on glass. The outer block copolymer matrix can then be removed.

Then, in a step 2224 the image of the remaining cylindrical masks can be transferred onto the underlying hard mask layer. This can be performed, for example, by performing a reactive ion etching (RIE) in a chemistry that is chosen to remove the hard mask material. Then, in a step 2226, the image of the patterned hard mask can be transferred to the underlying magnetic element material, thereby forming magnetic element pillars. This step can include performing an ion milling to remove portions of the magnetic memory element material that are not protected by the hard mask.

As can be seen, the above process results in magnetic memory element pillars that are formed at a density that is much greater than the physical limits of photolithography. In fact, the density can be several times greater than that which would be possible using photolithographic processes.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A method for manufacturing a magnetic memory element array, the method comprising:
   depositing a magnetic memory element material;
   depositing a hard mask layer over the magnetic memory element material;
   depositing a chemical template layer over the hard mask layer;
   patterning the chemical template with chemically patterned portions;
   depositing a block copolymer material having a natural period, wherein the chemically patterned portions of the patterned chemical template have a center to center spacing that is substantially equal to an integer multiple of the natural period of the block copolymer;
   annealing the block copolymer to form self assembled cylinders in the block copolymer material;
   converting the cylinders into hard mask cylinders;
   transferring the image of the hard mask cylinders onto the underlying hard mask layer; and
   transferring the image of the hard mask layer onto the underlying magnetic memory element material.

2. The method as in claim 1, wherein the converting the cylinders into hard mask cylinders further comprises repeating steps of a metal diffusion step and an oxidation step.

3. The method as in claim 1, wherein the converting the cylinders into hard mask cylinders further comprises exposure to metal vapor and exposure to water vapor.

4. The method as in claim 1, wherein the converting the cylinders into hard mask cylinders further comprises removing the cylinders to form openings in the block copolymer and filling the holes with a hard mask material.

5. The method as in claim 4, wherein the holes are filled with spin on glass.

6. The method as in claim 1, wherein the chemical patterning of the chemical template layer further comprises:
   covering the chemical template layer with a soluble polymer;
   forming the soluble polymer with openings to expose portions of the chemical template layer; and
   performing an etching.

7. The method as in claim 1, wherein the block copolymer is a second block copolymer, and wherein the patterning of the chemical template layer further comprises:
   depositing a soluble polymer over the chemical template layer;
   forming a mask structure over the soluble polymer, the mask having openings with a center spacing that is substantially an integer multiple of the natural period of the second block copolymer;
   depositing a first block copolymer over the mask structure
   annealing the first block copolymer to form self assembled cylinders in the first block copolymer;
   removing the cylinders in the first block copolymer to form openings in the first block copolymer; and
   performing an etching to pattern the chemical template layer through the openings in the first block copolymer.

8. The method as in claim 7, further comprising, after performing the ultraviolet exposure, removing the soluble polymer using a solvent.

9. A method for manufacturing an array of pillars, the method comprising:
   depositing a pillar material;
   depositing a hard mask layer over the pillar material;
   depositing a soluble polymer over the hard mask layer;
   forming a photoresist mask having openings having a spacing that is substantially equal to a natural period of a second block copolymer;
   depositing a first block copolymer over the photoresist mask;
   annealing the first photoresist mask to form self assembled cylinders in the first block copolymer;
   removing the cylinders in the first block copolymer to form openings in the first block copolymer;
   performing an etching to remove portions of the soluble solvent exposed through the openings in the first block copolymer, thereby forming openings in the soluble polymer;
   patterning portions of the chemical template exposed through the openings in the first block copolymer;
   removing the soluble polymer;
   depositing a second block copolymer; and
   annealing the second block copolymer to form self assembled cylinders over the patterned portions of the chemical template and also over areas between the patterned chemical template; and
   converting the cylinders of the annealed second block copolymer into etch resistant mask structures.

10. The method as in claim 9, further comprising after converting the cylinders of the annealed second block copolymer into etch resistant mask structures, performing a reactive ion etching to transfer the image of the cylinders of the annealed second block copolymer onto the underlying hard mask layer.

11. The method as in claim 10, further comprising after performing the reactive ion etching to transfer the image of the cylinders of the annealed second block copolymer onto the underlying hard mask layer, performing another material removal process to transfer the image of the hard mask onto the underlying pillar material.

12. The method as in claim 10, further comprising after performing the reactive ion etching to transfer the image of the cylinder of the annealed second block copolymer onto the underlying hard mask, performing an ion milling to remove portions of the pillar material that are not protected by the hard mask.

13. The method as in claim 9, wherein the converting the cylinders of the annealed second block copolymer into etch resistant mask structures further comprises diffusing a metal into the cylinders and oxidizing the metal.

14. The method as in claim 9, wherein the converting the cylinders of the annealed second block copolymer into etch resistant mask structures further comprises repeated steps of exposing the second block copolymer to a metal vapor and exposing the second block copolymer to water vapor.

15. The method as in claim 9, wherein the converting the cylinders of the annealed second block copolymer into etch resistant mask structures further comprises removing the cylinders of the second block copolymer to form cylindrical openings in the second block copolymer and depositing an etch resistant material.

16. The method as in claim 9, wherein the converting the cylinders of the annealed second block copolymer into etch resistant mask structures further comprises removing the cylinders of the second block copolymer to form cylindrical openings in the second block copolymer and depositing a spin on glass.

17. The method as in claim 16, further comprising after depositing the spin on glass, performing an etching.

* * * * *